(12) United States Patent
Bergstedt et al.

(10) Patent No.: US 6,433,423 B2
(45) Date of Patent: Aug. 13, 2002

(54) METHOD AND AN ARRANGEMENT RELATING TO CHIP CARRIERS

(75) Inventors: Leif Bergstedt, Sjömarken; Torbjörn Nilsson, Kungsbacka, both of (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 09/736,321

(22) Filed: Dec. 15, 2000

(30) Foreign Application Priority Data

Dec. 17, 1999 (SE) .............................................. 9904653

(51) Int. Cl.[7] .............................................. H01L 23/34
(52) U.S. Cl. .................. 257/728; 257/257; 257/720; 257/729; 257/708; 257/709
(58) Field of Search ................ 257/708, 709, 257/710, 728, 729, 720

(56) References Cited

U.S. PATENT DOCUMENTS

| | | | |
|---|---|---|---|
| 4,990,719 A | * 2/1991 | Wright | 174/52.4 |
| 5,012,386 A | 4/1991 | McShane et al. | 361/715 |
| 5,014,114 A | 5/1991 | Heckaman et al. | 257/707 |
| 5,151,769 A | * 9/1992 | Immorlica, Jr. et al. | 257/659 |
| 5,258,575 A | * 11/1993 | Beppu et al. | 174/52.4 |
| 5,783,857 A | * 7/1998 | Ziegner et al. | 257/664 |
| 6,198,163 B1 | * 3/2001 | Crowley et al. | 257/706 |
| 6,245,442 B1 | * 6/2001 | Towata et al. | 428/614 |

FOREIGN PATENT DOCUMENTS

| | | |
|---|---|---|
| EP | 0439919 | 8/1991 |
| JP | 62229987 A | * 10/1987 |
| WO | WO99/11106 | 3/1999 |

* cited by examiner

*Primary Examiner*—Jerome Jackson, Jr.
*Assistant Examiner*—Chris Chinoh Chu
(74) *Attorney, Agent, or Firm*—Burns, Doane, Swecker & Mathis, L.L.P.

(57) ABSTRACT

A microchip (3) is mounted to a chip carrier (1) in such a way as to avoid an earth fault between the chip (3) and the carrier (1). When mounting chips, the chip (3) is placed on a chip carrier (1) that includes an electrically and thermally conductive element (13). The element includes a surface (17) and a recess (15) arranged relative to the surface. The microwave chip (3) is arranged at the surface (17) of the electrically and thermally conductive element (13) by means of a fixing or bonding substance (19), which is disposed at least partially in the recess (15). When mounting the chip, the chip (3) is positioned so that an earth plane (3d) of the microwave chip (3) will lie level with the surface (17) of the electrically and thermally conductive element (13). The chip carrier (1) is suitable for a chip mounting process and can be produced both readily and inexpensively.

26 Claims, 2 Drawing Sheets

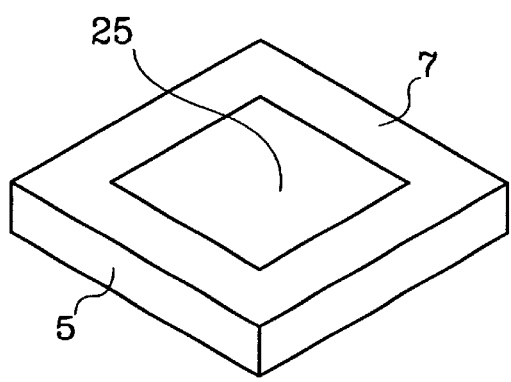
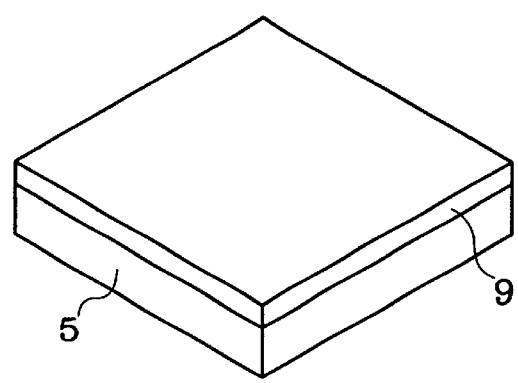
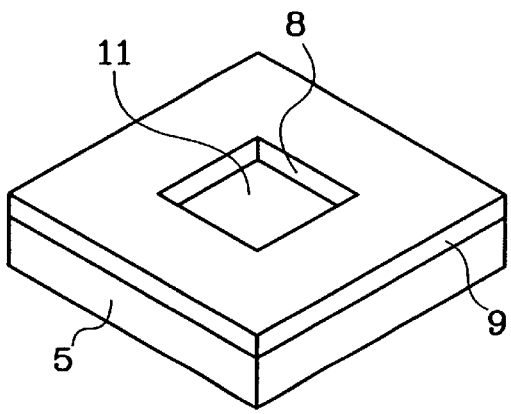
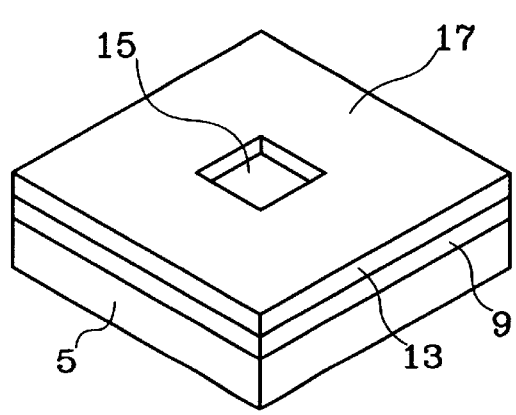
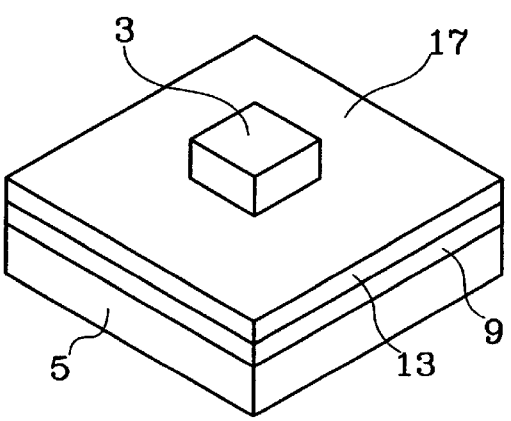
FIG. 2 (a–e)

METHOD AND AN ARRANGEMENT RELATING TO CHIP CARRIERS

FIELD OF INVENTION

This application claims priority under 35 U.S.C. §§119 and/or 365 to 9904653-4 filed in Sweden on Dec. 17, 1999; the entire content of which is hereby incorporated by reference.

The present invention relates to methods and apparatus pertaining to microwave chip carriers.

BACKGROUND OF THE INVENTION

Large and heavy equipment, such as waveguides, mixers, amplifiers, etc., were often earlier used in microwave technology. However, developments in semiconductor technology have enabled microwave functions for frequencies of about 2 GHz and higher frequencies to be implemented at present with components on integrated microwave chips, for instance with the aid of semiconductor processing techniques and materials such as gallium-arsenide (GaAS) and silicon (Si). Microwave chips are used for an increasing number of technical functions in microwave technology, such as amplifiers, mixers, frequency multipliers, etc., and it is not unusual to incorporate several functions in one single microwave chip. The microwave chips are less expensive, smaller and lighter in weight than traditional devices. Consequently, the microwave chip is well suited for use in many modern technical applications, for instance in aircraft electronics, radar, miniantennas, base stations, radio links, and so on.

The microwave chip is constructed around a dielectric substrate that has semiconductor components disposed on its upper surface. The semiconductor components are normally connected with microstrip conductors (or coplanar conductors). The microstrip conductors include signal conductors disposed on the upper side of the substrate, and an electrically conductive element that is adapted to define an earth plane for the signal conductors on the underside of the substrate. The microwave chip is normally very small (about 2–10 $(mm)^2$) and thin (about 0.1 mm).

The microwave chips are normally disposed on a chip carrier, said carrier normally including a carrier element in the form of a piece of material that has context-suitable properties. The microchip is mounted on a surface of the carrier element by means of an electrically conductive bonding substance, such as solder or glue.

There are several reasons for mounting microwave chips on chip carriers. One reason is because the carrier provides mechanical support for the chip. The carrier also enables heat to be conducted from the microwave chip to a cooling sink more effectively, for instance. The carrier also often forms an earth potential for the earth plane of the chip. Normally, the carrier is much larger than the chip, so as to provide space for elements required to connect the chip to peripheral equipment.

Thus, the carrier element will preferably consist of material that will conduct heat and current effectively. Magnet carrying ferrite cylinders are often disposed on the carrier. The thermal expansion of the carrier element will also preferably be adapted to the thermal expansion of the microwave chip mounted on the carrier. Typical carrier element materials are, for instance, copper-tungsten (CuW), copper-molybdenum (CuMo) and aluminium-silicon carbide (AlSiC), these materials being suitable for microwave chips in gallium-arsenide; or aluminium-nitride (AlN), which is suitable for silicon microwave chips.

However, the known technology for mounting microwave chips on chip carriers has certain drawbacks. When the microwave chip is bonded to the carrier elements, the bonding substance forms an impedance which gives rise to an undesirable potential difference (earth fault) between the earth plane of the microwave chip and the earth potential of the carrier element. Furthermore, the materials used in chip carriers are often very expensive—it is not unusual for the chip carrier to cost up to 50% of the cost of the actual microwave chip. This high chip carrier cost has not earlier been considered a significant drawback, as the microwave chips obtain significant advantages in comparison with traditional techniques. The rapid development in technology and the increasing competition within this technical field, however, has meant that the high costs of the chip carriers must now be considered to constitute a burdensome drawback.

SUMMARY OF THE INVENTION

The problem mainly addressed by the present invention resides in providing method and means that will enable microwave chips to be mounted on chip carriers in a manner that will reduce an earth fault between the microwave chip and a chip carrier to a minimum.

In brief, this problem is solved in the following manner. The microwave chip is mounted on a chip carrier that includes an electrically and thermally conductive element in which a recess is provided relative to a surface of said element. The microwave chip is bonded or fastened to the surface of the electrically and thermally conductive element by means of a bonding substance that is disposed at least partially in the recess. The chip is positioned so that a chip earth plane will be level with the surface of the electrically and thermally conductive element. The distance between the earth plane and the surface is therefore very small, and consequently no earth fault will occur between the earth plane and said surface.

Thus, an aim of the present invention is to enable microwave chips to be mounted on chip carriers so that no earth fault will occur, this aim being achieved with methods and arrangements according to the invention.

Thus, a main advantage obtained when mounting chips in the aforesaid manner is that the occurrence of earth faults is avoided. Another advantage is that heat dissipation from the microwave chip is made more effective to some extent, due to the increase in the contact surface area between the bonding substance and the electrically and thermally conductive element provided by the recess.

More explicitly, the aforesaid problem is solved in accordance with specific embodiments. For instance, if the electrically and thermally conductive element is comprised of a layer of copper or gold, as is preferred, the bonding substance will be solder or glue, for example.

The present invention also addresses the further problem of providing a chip carrier that can be produced simply and inexpensively and that is also suitable for the aforesaid mounting process.

In brief, this further problem is solved with a chip carrier that includes at least a first surface on which a dielectric layer is disposed such as to contribute in forming a pit on the first surface. An electrically and thermally conductive layer is arranged on the dielectric layer and in the pit such that the electrically and thermally conductive layer will obtain a surface in relation to which there is arranged a recess in connection with the pit.

A further aim of the invention is therefore to provide a chip carrier which is suited to said mounting process and which can be produced readily and inexpensively, wherein the invention also includes a method of producing such a chip carrier.

More explicitly, this further problem is solved by specific embodiments. For example, the carrier element may consist of a sheet of brass, aluminium or material that has similar properties and price. The dielectric layer is comprised, for instance, of photosensitive material that is laminated on the carrier element, wherewith the pit is suitably obtained by providing an opening in the dielectric layer. The opening, or cut-out, may be obtained by treating the dielectric layer photochemically. The electrically and thermally conductive layer may be comprised of copper or gold that has been panel-plated on top of the dielectric layer, for instance.

The main advantages afforded by the chip carrier is that it is suited to the aforesaid mounting process, and that it is relatively inexpensive and easy to manufacture.

The invention will now be described in further detail with reference to exemplifying embodiments thereof and also with reference to the accompanying drawings.

BRIEF DESCRIPTION OF THE DRAWINGS

FIGS. 2(a–e) are perspective views of the various stages in the manufacture of a chip carrier and illustrate mounting of microchips on the manufactured chip carrier.

DESCRIPTION OF PREFERRED EMBODIMENTS

Figure 1:
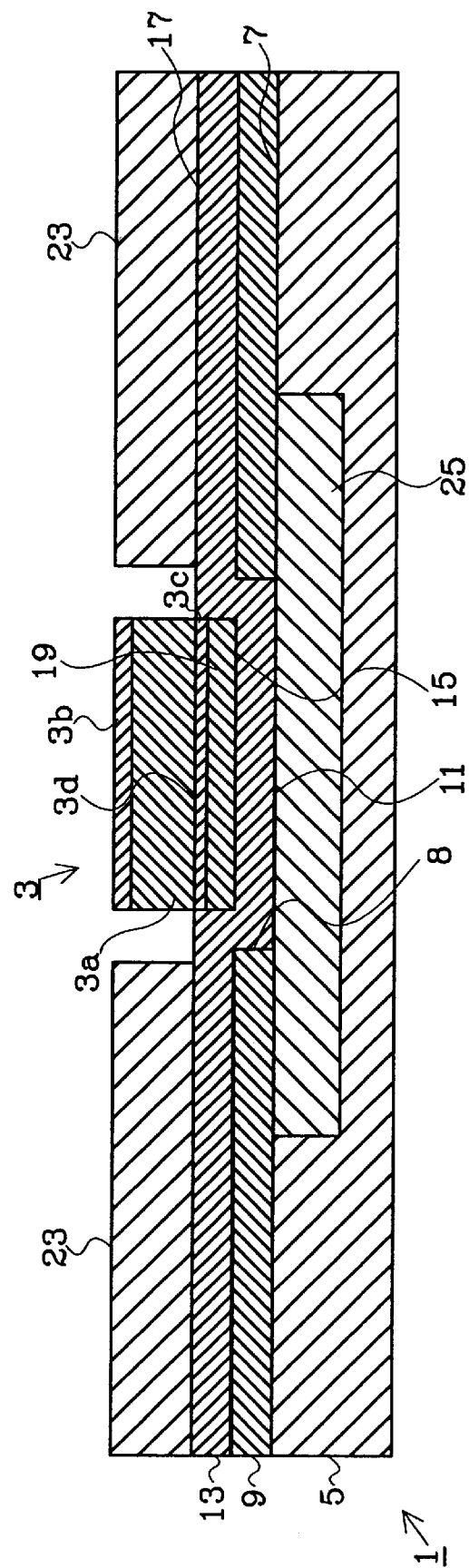
FIG. 1 is a cross-sectional view of an exemplifying embodiment of an inventive chip carrier adapted to carry a microwave chip.

FIG. 1 is a cross-sectional view of an exemplifying embodiment of an inventive chip carrier 1 which is intended to carry a microchip 3. The carrier 1 includes a carrier element 5 of relatively good thermal conductivity (about 80 W/mK and higher). The carrier element 5 of the illustrated embodiment comprises a metal plate, for instance made of brass, aluminium or some other relatively cheap metal alloy or metal. The carrier element 5 includes a generally planar surface 7 (the upper side of the element 5 shown in FIG. 1) on which there is disposed a layer 9 of dielectric material. The dielectric layer 9 includes a through-penetrating, rectangular aperture 8 which, together with the surface 7 of the carrier element, forms a pit 11. A layer of material 13 that has a high electrically and thermally conductive capacity is disposed on top of the dielectric layer 9. The electrically and thermally conductive material is, for instance, a metal that is suitable to this end, such as copper or gold. In the illustrated case, the layer 13 has a generally constant thickness and is also disposed in the pit 11. There is therefore formed in a surface 17 (the upper side of the layer 13 in FIG. 1) of the layer 13 a recess 15 in connection with the pit 11. The size, shape and depth of the recess 15 is determined by the size, shape and depth of the pit 11 and also by the thickness of the layer 13.

The microwave chip 3 includes a dielectric substance 3a that has a first side (the upper side in FIG. 1) on which there is disposed a component layer 3b that includes semiconductor components and signal conductors (not shown). A metal layer 3c is disposed on a second side of the substrate 3a, the underside in FIG. 1. The side of the metal layer 3c that lies proximal to the component layer 3b (the upper side in FIG. 1) defines an earth plane 3d for the signal conductors in the component layer 3b.

The microwave chip 3 is fastened to the layer 13 by means of a bonding substance or fixing agent 19, which may be solder or glue, for instance. In the illustrated case, the bonding substance 19 is disposed in the recess 15 and the microwave chip 3 is disposed in the recess such that the earth plane 3d will lie level with the surface 17 of the layer 13 (its upper surface), in other words the earth plane 3d lies in the same plane as the surface 17. When the earth plane 3d is level with the surface 17 on the layer 13, practically no earth fault will occur between the microwave chip 3 and the layer 13, since any conductive path through the bonding substance 19 between the surface 17 and the earth plane 3d will be very short. This is particularly beneficial in respect of microwave chips for high frequencies (frequencies of about 38 GHz and higher).

Together with the carrier element 5, the layer 13 forms a link in a heat dissipating cooling chain that effectively conducts heat away from the microwave chip 3. Alternatively, cooling sinks, such as cooling fins, cooling rods, coolant-filled channels or equivalent devices may be connected to the layer 13 or to the carrier element 5, so as to further enhance the dissipation of heat from the microwave chip 3. When the bonding substance 19 is disposed in the recess 15, a slightly larger contact surface is obtained between the bonding substance 19 and the layer 13 (as compared with a bonding substance 19 that is placed directly on the surface 17 of the layer 13, as in the case of conventional chip mounting processes), therewith increasing the dissipation of heat from the microwave chip 3 to some extent.

A sheet 23 of dielectric material is disposed on top of the layer 13. Mask work, pads (i.e. solder for wire-bonding connection surfaces), decoupling capacitors and any other surface-mounted components (not shown) required to connect the microwave chip 3 electrically to surrounding equipment are disposed on the dielectric layer 23. The dielectric layer 23 is adapted so that its upper surface will be level with the upper surface of the microwave chip 3 and therewith enable electrical connection of the microwave chip 3 to be achieved readily and inexpensively (minimises material consumption).

The chip carrier 1 includes an block 25 which is let into the carrier element 5 beneath the pit 11 and secured to said element by means of glue, solder or some equivalent substance disposed on the underside and the edges of the block 25. Epoxy resin and thermoplastic adhesives are suitable glues for securing the block 25. However, it will preferably be ensured that the properties of the glue used will not have any deleterious effect on the dielectric layer 9. In the illustrated embodiment, the block 25 is inserted so that one surface of the block (the upper side of the block 25 in FIG. 1) will form a part of the surface 7 on which the dielectric layer 9 is disposed. The block 25 is made of a material whose coefficient of thermal expansion corresponds generally to the coefficient of thermal expansion of the microwave chip 3. The intention of the block 25 is to cause thermal expansion of the carrier 1 to accompany thermal expansion of the microwave chip 3, so as to reduce the risk of harmful thermal stresses occurring in the microwave chip 3. In one preferred embodiment of the invention, the block 25 is much larger than the pit 11 and the microwave chip 3, and the dielectric layer 9 and the electrically and thermally conductive layer 13 are relatively thin, so that thermal expansion of the carrier 1 in an area around the microwave chip 3 will be determined essentially by the thermal expansion of the block 25. The dielectric layer 9 and the electrically and thermally conductive layer 13 will suitably have thicknesses of about 20 μm.

The coefficient of thermal expansion α of microwave chips typically lies in a range of from about 1 ppm/C.° to about 10 ppm/C.° ($\alpha \approx 3$ ppm/C.° in the case of silicon chips while $\alpha \approx 6.5$ ppm/C.° in respect of gallium-arsenide chips). In this context, a copper-molybdenum alloy is a suitable choice of material for the block 25, where the copper and molybdenum end-parts are selected so that the block 25 will obtain an appropriate coefficient of thermal expansion while taking into account the type of chip for which the carrier 1 is intended. However, the block 25 may alternatively have some other material composition, for instance an aluminium-silicon (AlSi), aluminium-nitride (AlN) or a copper-tungsten (CuW) composition.

In the case of an alternative to the embodiment of FIG. 1, the block 25 is excluded and the whole of the carrier element 5 is, instead, made of a material whose coefficient of thermal expansion corresponds generally to the coefficient of thermal expansion of the microwave chip 3. Because such materials are normally quite expensive, the embodiment of FIG. 1 that includes the block 25 is normally preferred from a cost aspect.

There will now be described by way of example an inventive method suitable for the manufacture of the chip carrier 1 shown in FIG. 1. The method is described with reference to FIGS. 2(a–e), which are perspective views showing various stages in the manufacturing process.

The method, or process, is begun by selecting the carrier element 5 (see FIG. 2a) with the inserted block 25. The method is continued by laminating the dielectric layer 9 on the planar surface 7 of the carrier element 5 (see FIG. 2b). In a preferred embodiment of the invention, the dielectric layer 7 is comprised of a photosensitive material, for instance the photosensitive epoxy varnish retailed by the company Cibas under the trade name Probilek. The photosensitive dielectric layer 7 is exposed on a surface where the opening or aperture 8 shall be obtained. Development is then effected so that the opening 8, and therewith also the pit 11, are formed (see FIG. 2c). Alternatively, the opening 8 can be obtained in some other way, for instance by laser treatment of the dielectric layer 9 (burning away the layer). The electrically and thermally conductive layer 13 is conveniently formed by metal plating, e.g. copper plating, the dielectric layer 9 and the pit 11 (see FIG. 2d). The recess 15 is therewith also obtained in the surface 17 (the upper side) of the electrically and thermally conductive layer 13 in connection with the pit 11. In a preferred embodiment of the invention, the entire electrically and thermally conductive layer 13 is plated at once, with the aid of a so-called panel-plating process.

When mounting the microwave chip 3 (see FIG. 2e), the microwave chip 3 is fastened to the electrically and thermally conductive layer 13 with the aid of a bonding substance 19 disposed in the recess 15. It is ensured at this stage that the earth plane 3d of the microwave chip 3 is level with the surface 17 of the layer 13.

Manufacture of the chip carrier 1 is both simple and inexpensive. Well known processes (lamination, photochemical treatment, panel-plating, etc.) suitable for mass production can be used in the manufacture. The inserted block 25 enables the consumption of expensive material to be reduced, with no negative effect on the properties of the carrier 1. Standardised blocks are also available, therewith limiting costs still further as a result of avoiding special manufacture of the blocks.

The chip carrier 1 can be used in mounting all forms of microwave chips. The higher the frequency, the more important it is to avoid earth faults, since the earth potential is then local and the distance to correct earth therefore of decisive significance. The carrier 1 is therefore particularly beneficial for mounting microwave chips for frequencies of from about 40 GHz and higher

What is claimed is:

1. A method of manufacturing a chip carrier, comprising the steps of:

selecting a carrier element that has at least one first surface having at least one first section, wherein the at least one first section including a thermal expansion means for having a thermal expansion corresponding to a microwave chip to be mounted on the chip carrier;

disposing a dielectric layer on the first surface of the carrier element such that the dielectric layer forms at least one pit on top of the first surface of said carrier element; and disposing an electrically and thermally conductive layer on the dielectric layer and in the pit wherein a surface of the electrically and thermally conductive layer has a recess in the pit.

2. A method according to claim 1, wherein a selection of the carrier element involves selecting a carrier element that has a material composition which includes a metal or metal alloy including aluminum or brass.

3. A method according to claim 1, wherein the arrangement of the dielectric layer includes providing in the dielectric layer an opening to form the pit.

4. A method according to claim 3, wherein the dielectric layer is comprised of material that has photosensitive properties, and wherein provision of the opening comprises forming said opening with an aid of a photochemical process.

5. A method according to claim 1, wherein an arrangement of the electrically and thermally conductive layer involves a formation of said electrically and thermally conductive layer with an aid of a panel-plating process.

6. A method according to claim 1, wherein an arrangement of the electrically and thermally conductive layer involves providing said electrically and thermally conductive layer with a material composition that includes copper.

7. A method according to claim 1, wherein an arrangement of the dielectric layer involves disposing the dielectric layer in a manner to form the pit in said first section.

8. A method according to claim 7, wherein the arrangement of the dielectric layer and the electrically and thermally conductive layer involves disposing both of said layers with thicknesses such that thermal expansion of the electrically and thermally conductive layer in the recess is determined essentially by the thermal expansion of the first section.

9. A method according to claim 7, wherein the first section has a material composition that includes an alloy which contains copper and molybdenum in predetermined proportions.

10. A method according to claim 7, wherein the first section has a material composition that includes an alloy which contains copper and tungsten in predetermined proportions.

11. A method according to claim 7, wherein the first section has a material composition that contains aluminum and silicon carbide in predetermined proportions.

12. A method according to claim 7, wherein the first section has a material composition that includes aluminium nitride.

13. A method of mounting microwave chips comprising steps of fastening a microchip to a recessed surface of an electrically and thermally conductive element of a chip carrier by means of a mounting substance that is disposed at least partially in a recess , wherein fastening of the microwave chip involves positioning the microwave chip in relation to a non-recessed surface of the electrically and thermally conductive element so that an earth plane of the microwave chip lies in a same plane as the non-recessed surface.

14. A chip carrier, comprising:
   a carrier element that has at least one first surface which includes at least one first section, the at least one first section including thermal expansion means for having a thermal expansion corresponding to a thermal expansion of a microwave chip to be mounted on the chip carrier;
   a dielectric layer disposed on said first surface of the carrier element so that said dielectric layer forms at least one pit on top of the first surface of said carrier element; and
   an electrically and thermally conductive layer disposed on the dielectric layer and in said pit, wherein a surface of the electrically and thermally conductive layer has a recess in said pit.

15. A chip carrier according to claim 14, wherein the carrier element has a material composition that includes a metal alloy or metal, including brass or aluminum.

16. A chip carrier according to claim 14, wherein the dielectric layer includes an opening to form said pit.

17. A chip carrier according to claim 16, wherein the dielectric layer is comprised of material that has photosensitive properties, and wherein the opening is obtained with an aid of a photochemical process.

18. A chip carrier according to claim 14, wherein the electrically and thermally conductive layer is obtained by panel plating.

19. A chip carrier according to claim 14, wherein the electrically and thermally conductive layer has a material composition that includes copper.

20. A chip carrier according to claim 14, wherein the pit is formed in the first section.

21. A chip carrier according to claim 20, wherein the dielectric layer and the electrically and thermally conductive layer have thicknesses such that thermal expansion of the electrically and thermally conductive layer in the recess is determined essentially by the thermal expansion of the first section of the carrier element.

22. A chip carrier according to claim 20, wherein the first section has a material composition that includes an alloy that contains copper and molybdenum in predetermined proportions.

23. A chip carrier according to claim 20, wherein the first section has a material composition that includes an alloy which contains copper and tungsten in predetermined proportions.

24. A chip carrier according to claim 20, wherein the first section has a material composition that includes aluminum and silicon carbide in predetermined proportions.

25. A chip carrier according to claim 20, wherein the first section has a material composition that includes aluminum nitride.

26. A system, comprising:
   a chip carrier that has an electrically and thermally conductive element which includes a recessed surface for mounting microwave chips; and
   a microwave chip, wherein said chip is secured to the recessed surface by means of a bonding or fixing substance which is disposed at least partially in a recess, and wherein the chip is positioned relative to a non-recessed surface of the electrically and thermally conductive element wherein an earth plane of the microwave chip lies in a same plane as the non-recessed surface.

* * * * *